United States Patent [19]

Matsuda et al.

[11] Patent Number: 5,448,421
[45] Date of Patent: Sep. 5, 1995

[54] METHOD FOR POSITIONING AN INFORMATION PROCESSING HEAD BY DETECTING A MAGNETIZATION PATTERN ON A MAGNETIC MATERIAL POSITIONED RELATIVE TO A RECORDING MEDIUM AND A PROCESS FOR FORMING A RECORDING AND/OR REPRODUCING CANTILEVER TYPE PROBE

[75] Inventors: Hiroshi Matsuda; Hisaaki Kawade; Ken Eguchi; Etsuro Kishi; Hideyuki Kawagishi; Kiyoshi Takimoto, all of Kanagawa; Yuji Kasanuki, Tokyo; Yoshihiro Yanagisawa; Toshihiko Takeda, both of Kanagawa, all of Japan

[73] Assignee: Canon Kabushiki Kaisha, Tokyo, Japan

[21] Appl. No.: 136,704

[22] Filed: Oct. 15, 1993

Related U.S. Application Data

[62] Division of Ser. No. 755,579, Sep. 5, 1991, Pat. No. 5,278,704.

[30] Foreign Application Priority Data

Sep. 5, 1990 [JP] Japan .................................. 2-233177
May 30, 1991 [JP] Japan .................................. 3-153772

[51] Int. Cl.$^6$ .................................................. G11B 5/02
[52] U.S. Cl. ........................................ 360/55; 369/126; 365/225.5
[58] Field of Search .................. 360/55, 59, 114, 57, 360/58, 60, 61; 369/126, 101, 13; 250/306, 442.1, 307; 365/171, 225.5, 55, 151, 118

[56] References Cited

U.S. PATENT DOCUMENTS

| | | | |
|---|---|---|---|
| 4,998,016 | 3/1991 | Nose et al. | 250/306 |
| 5,187,367 | 2/1993 | Miyazaki et al. | 250/306 |
| 5,200,935 | 4/1993 | Watanabe et al. | 369/13 |
| 5,202,879 | 4/1993 | Oguchi et al. | 369/126 |
| 5,278,704 | 1/1994 | Matsuda et al. | 360/55 |

FOREIGN PATENT DOCUMENTS

| | | |
|---|---|---|
| 0338864 | 10/1989 | European Pat. Off. . |
| 0345696 | 12/1989 | European Pat. Off. . |
| 0360337 | 3/1990 | European Pat. Off. . |
| 63-161552 | 5/1988 | Japan . |
| 63-161553 | 7/1988 | Japan . |
| 64-53363 | 3/1989 | Japan . |
| 64-53364 | 3/1989 | Japan . |

OTHER PUBLICATIONS

Binnig, et al. "Scanning Tunneling Microscopy," Helvetica Physica Acta, vol. 55, 1982, pp. 726 through 735.
Hokkyo, et al., "Comparison of the Characteristics for Perpendicular Magnetic Recording by Single-Pole Head With That by Ring Head," vol. 8, No. 1, 1984, pp. 22 through 27.
Martin, et al., Magnetic Imaging by "Force Microscopy" With 1000 Å Resolution, Appl. Phys. Lett., vol. 50, No. 20, Mar. 1987, pp. 1455–1457.

*Primary Examiner*—Ali Neyzari
*Attorney, Agent, or Firm*—Fitzpatrick, Cella, Harper & Scinto

[57] ABSTRACT

A method for positioning an information processing head at a predetermined position on a recording medium includes detecting a predetermined magnetization pattern on a magnetic material having a predetermined positional relation to a recording region of the recording medium by a magnetization detector having a predetermined positional relation to the information processing head, generating a signal indicative of a relative position of the information processing head with respect to the recording medium based on a result of the detecting step and moving the information processing head and the recording medium relatively to position the information processing head at the predetermined position with respect to the recording medium based on the generated signal, and a process for forming a cantilever-type probe capable of indicating a magnitude of a magnetic force between the probe and a recording medium and capable of performing at least one of a recording operation and a reproducing operation on the recording medium.

4 Claims, 20 Drawing Sheets

METHOD FOR POSITIONING AN INFORMATION PROCESSING HEAD BY DETECTING A MAGNETIZATION PATTERN ON A MAGNETIC MATERIAL POSITIONED RELATIVE TO A RECORDING MEDIUM AND A PROCESS FOR FORMING A RECORDING AND/OR REPRODUCING CANTILEVER TYPE PROBE

This application is a divisional of prior application, Ser. No. 07/755,579 filed Sep. 5, 1991, now U.S. Pat. No. 5,278,704.

BACKGROUND OF THE INVENTION

1. Field of the Invention

The present invention relates to an information processing apparatus comprising a recording-reproducing apparatus which is based on the principle of a scanning tunnel microscope (STM).

2. Related Background Art

In recent years, memory materials form the nucleus of electronics industries employing products such as computers and their related instruments, video discs, digital audio discs, and the like and development of such materials is also under active progress. The performance demanded for memory materials may differ depending on uses, but may generally include:

(1) high density and large recording capacity;
(2) rapid response speed of recording and reproducing;
(3) small power consumption;
(4) high productivity and low cost; and the like.

Heretofore, semiconductor memories or magnetic memories employing semiconductor or magnetic material as the base material have been predominant. However, with the recent advancement of laser techniques, inexpensive and high density recording media with optical memory employing an organic thin film formed from an organic dye, photopolymer, and the like are now being introduced into the field.

On the other hand, a scanning tunnel microscope (hereinafter abbreviated as STM) capable of observing directly the electron structure of the surface atoms of a conductor has recently been developed [G. Binnig et al., Helvetica Physica Acta, 55, 726 (1982)], and it has become possible to measure both single crystalline and amorphous materials with high resolving power for a real space image. Further, it has the advantage that observations can be made at low power without incurring damage by exposing the medium to current.

Further, an STM can be actuated in air and applied to various materials, and therefore a broad scope of applications is expected.

STM is based on the phenomenon that tunnel current flows when a metal probe (probe electrode) and an electroconductive substance approach each other at a distance of about 1 nm with a voltage applied therebetween. This current is very sensitive to the distance change between the metal probe and the electroconductive substance, and by scanning the probe so that the tunnel current is maintained to be constant, the surface structure of the real space can be drawn and, at the same time, a variety of information concerning the electron cloud of the surface atoms can be read. In this case, a resolving power of intrasurface direction is about 1 Å.

Accordingly, by applying the principle of STM to recording and reproducing, it is possible to record and reproduce information with a high density on an atomic order (several Å).

Typical methods of recording and reproducing include recording by making the surface state of a recording layer change using either a particle beam (electron beam or ion beam), high energy electromagnetic waves such as x-rays etc. or energy rays such as visible light or ultraviolet light, etc. Reproducing is performed using STM. Alternatively, as a recording layer, a thin layer containing a material having a memory effect to a voltage-current switching characteristic, such as an organic compound with a $\pi$-electron system or a chalcogenite is used and recording and reproducing are performed using STM. (See Japanese Patent Laid-Open Application No. 63-161552 or No. 63-161553). In this method, the probe electrode which is used in recording and reproducing is required to move precisely above an information-recorded portion of the recording medium. An outline of the position control in this method is as follows.

The size of a recorded bit is on an atomic order (several Å). Therefore, a probe is moved above a desired recording portion of a recording medium in a direction perpendicular to a recording surface of the recording medium at a distance of 10 mm to 1 $\mu$m by a piezoelectric element, a stepping motor, an inchworm or by hand (this movement is called coarse movement). The probe is then moved in the atomic order range of 1 $\mu$m to 0.1 mm by another driving mechanism, such as a piezoelectric element or the like. (This movement is called fine movement).

The position control of coarse movement and fine movement is based on a standard scale which is provided on a recording medium in advance and contains some information about position.

For example, as a standard scale for fine control, Japanese Patent Laid-Open Applications No. 1-53363 and 1-53364 disclose a method which utilizes atomic period based on a regular arrangement of atoms in the surface of a recording medium, for tracking.

As a piezoelectric element capable of moving a probe and a recording medium, lead titanate zirconate (PZT) is often used because it can enhance the amount of a displacement. PZT, however has a non-linear voltage-displacement characteristic and non-linear hysteresis.

It is possible to perform precise position control of a probe because PZT has a linearity in voltage-displacement characteristic toward fine displacement. However, it is difficult to perform a precise position control for coarse displacement because such linearity is not realized as the amount of displacement increases. Further, it is difficult to obtain a crystal without defects or cracks over the range of more than micron order, when a standard scale for fine adjustment using the above crystalline cell is used.

SUMMARY OF THE INVENTION

Accordingly, an object of the present invention is to provide an information processing apparatus in an electrical high density recording-reproducing system by use of a probe electrode, which can perform information-processing at high density and high precision by introducing a highly precise position-detecting function and position-controlling function.

The above object can be accomplished by performing the position detection of a probe and/or a recording medium by use of a magnetization pattern which is recorded in a magnetic layer contained in a recording medium.

In one aspect of the present invention, there is provided an information processing apparatus comprising a recording medium, a magnetic material having a predetermined magnetization pattern with respect to the recording medium, a first means for detecting a magnetization pattern of the magnetic material, a second means for detecting a change of the recording medium, and a third means for driving the recording medium and the second means relative to each other based on a signal from the first means.

In another aspect of the present invention, there is provided an information processing apparatus, wherein, the second means comprises a conductive probe electrode disposed close to the recording medium, a fourth means for applying a voltage between the probe electrode and the recording medium and a fifth means for detecting a current flowing between the probe electrode and the recording medium.

In still another aspect of the present invention, there is provided an information processing apparatus, wherein, the magnetic material comprises a perpendicular magnetization film.

In still another aspect of the present invention, there is provided an information processing apparatus, wherein, the first means and the second means are in a single unit, and the recording medium and the magnetic material are in a single unit.

In still another aspect of the present invention, there is provided an information processing apparatus, wherein, the recording medium is circular and means are provided to rotate the recording medium around vertical axis.

DETAILED DESCRIPTION OF THE PREFERRED EMBODIMENTS

In a preferred embodiment, detecting of a magnetization pattern is described as follows.

The position control in the present invention can be performed utilizing the magnetization pattern formed in the magnetic layer contained in the recording medium as a standard scale.

Particularly, the magnetization pattern is detected by a magnetization detecting apparatus and the position control for coarse movement of the probe and the recording medium can be performed, based on a signal from the magnetization detecting apparatus.

As an example of the magnetization pattern, there is a pattern as indicated in FIG. 1(a). An arrangement of N pole and S pole (hereinafter abbreviated as N and S) is formed linearly and this direction is defined as the x-axis. The recorded width of N and S in the direction of the x-axis indicates that only one of N is $2\lambda 1$ and the others are $\lambda 1$ as shown in FIG. 1(a).

When a magnetic head H is scanned in the direction of the x-axis, the output corresponding to a repeated N and S is obtained as a function of time (t) by the magnetic head as shown in FIG. 1(b). This signal is, for example, rectified as shown in FIG. 1(c), and the rectified signal and a clock signal as shown in FIG. 1(d) are compared. If the rectified signal and the clock signal coincide, a pulse occurs as shown in FIG. 1(e). Herein a pulse width T of the clock signal is defined $T=\lambda 1/v$ when a relative speed of the magnetization pattern and the magnetic head is v.

As apparent in FIG. 1(e), in a region with a recorded width of $2\lambda 1$, a pulse does not occur during time 2T, but in other regions, a pulse occurs at T intervals.

Herein, as shown in FIG. 1(e), the symbols a, b, c . . . are marked in each pulse in the sequence of pulse occurrence.

A pulse does not occur during time 2T between a pulse "a" and a pulse "b". When a pulse does not occur during 2T, the region of the magnetization pattern corresponding to that between pulse "a" and pulse "b" is defined "an origin" and "region O" as shown in FIG. 1(f). Pulse "c" occurs only during time T after pulse "b" occurs. The magnetization region corresponding to a region between the pulse "b" and pulse "c" is defined as "region 1". In a similar way, the other magnetization regions are defined "region 3", "region 4", "region 5". In this way, recorded regions of N and S are numbered and the magnetization pattern is made a standard scale. As described above, the magnetization pattern can be made a coordinate axis by defining "an origin". For example, the repeated patterns of N and S which are arranged linearly are arranged on a recording layer so as to be perpendicular to each other as shown in FIG. 2 and are made respectively, x-axis and y-axis.

Figure 2:
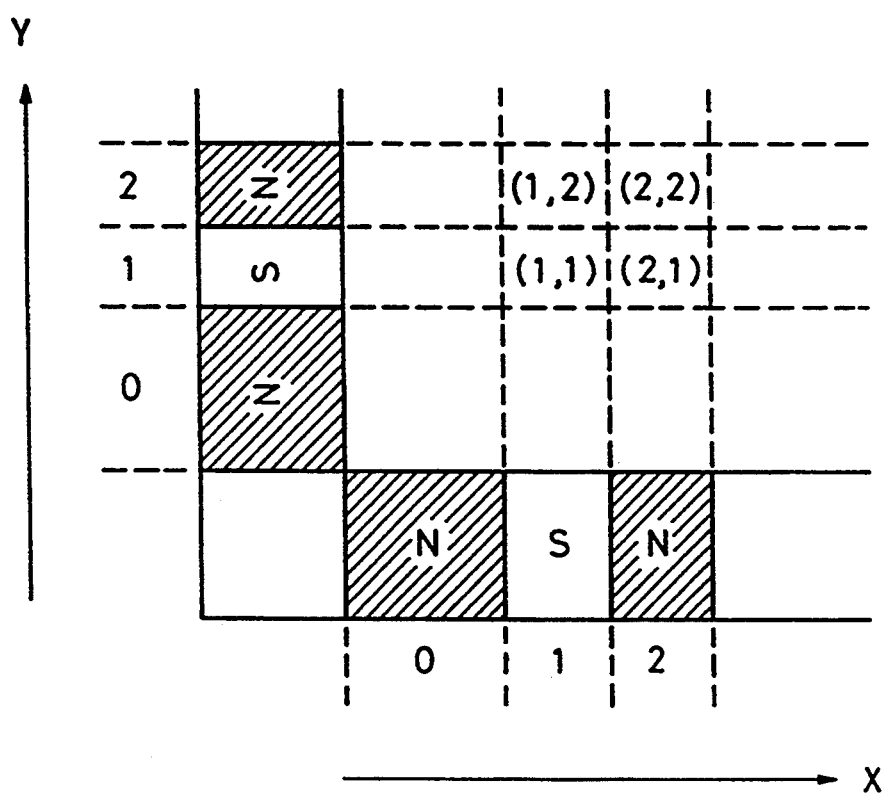
FIG. 2 illustrates a setup of two-dimensional coordinates in Example 1 using the magnetization pattern.

As the result, a recording layer can be divided into regions differentiated by coordinates as shown in FIG. 2.

The following examples are illustrative only and typify certain preferred embodiments. Other aspects of the invention will be apparent to those skilled in this art.

Example 1

Figure 3:
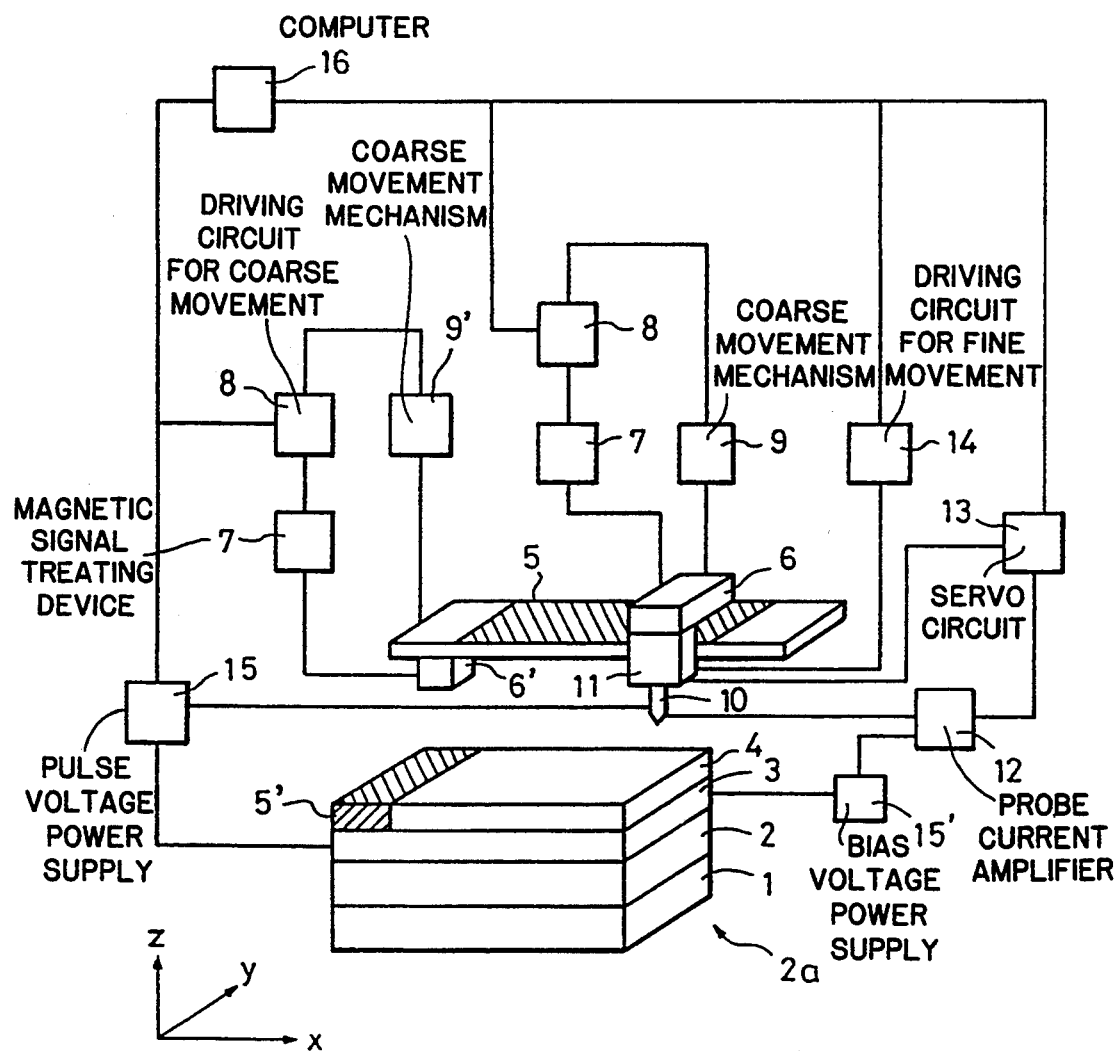
FIG. 3 is a block diagram illustrating an information processing apparatus of Example 1.

FIG. 3 shows a preferred schematic view of an information processing apparatus of the present invention. The entire apparatus is placed on an antivibration mount 1o Recording is conducted on a recording unit 2a of which 2 is a glass substrate (tradename: #7059, available from Corning Glass), 3 is a substrate electrode which comprises an Au layer with thickness of 400 Å, deposited by vacuum deposition. Reference numeral 4 is a recording layer which comprises a monomolecular film or a built-up film of a squarilium dye formed by the well known Langmuir-Blodgett (LB) method and 5' is a magnetic layer in which the magnetization pattern for Y-direction is recorded. Reference numeral 5 is a magnetic layer in which the magnetization pattern for the x-direction is recorded.

Figure 4:
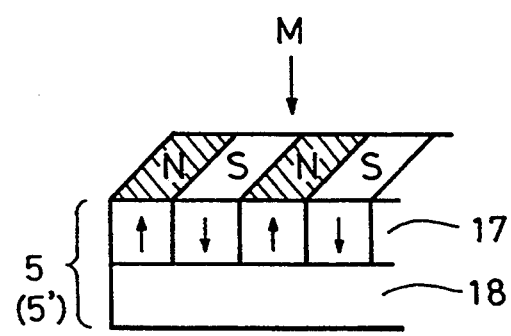
FIG. 4 is a constitutional view of the magnetic layer.

The structures of the magnetic layers 5 and 5' are shown in FIG. 4. Reference numeral M denotes a surface opposite to a magnetic sensor.

In this Example, the magnetic layers 5 and 5' each comprise a permalloy (NiFe) layer 18 and a perpendicular magnetization film 17 represented by a Co—Cr layer.

The magnetic layers 5 and 5' are each prepared by sputtering NiFe layer 18 (the thickness of 0.5 μm) on the substrate electrode 3 and Co—Cr layer 17 (the thickness of 0.15 μm) thereon.

Figure 5:
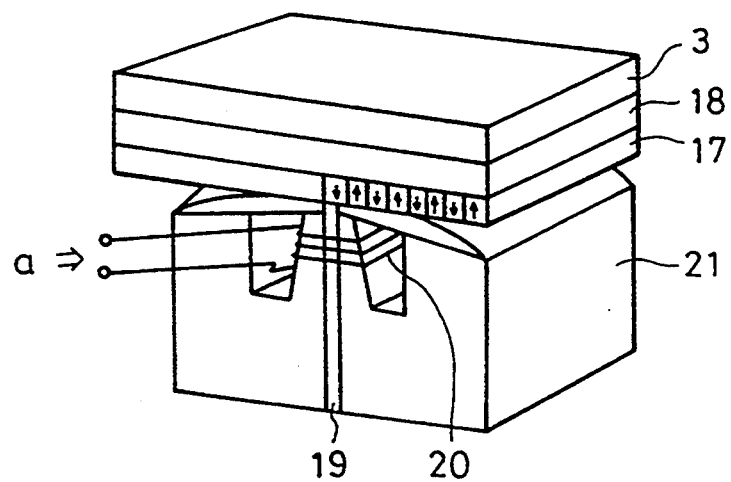
FIG. 5 illustrates a WSP type head.

In the magnetic layers 5 and 5' thus prepared, the magnetization patterns are recorded as a standard scale. Recording is performed using a monomagnetic pole. FIG. 5 illustrates a shape of the monomagnetic pole and recorded information of the magnetization pattern. In FIG. 5, a head known in the art as a WSP type is used in recording and reproducing in a perpendicular magnetization film.

Reference numeral 19 is a principal magnetic pole which comprises Co—Zr amorphous thin film and has a thickness of 0.3 μm. Reference numeral 20 is a coil and 21 is a magnetic ferrite.

Electrical signal "a" is sent to this magnetic head as shown in FIG. 5, and the magnetization patterns are recorded in the magnetic layers 5 and 5' so that λ1 how in FIG. 1(a) may be 0.3 μm. It has been reported that a WSP type magnetic head can record a repeated pattern of N and S with a cycle of 0.3 μm in the magnetic layer 5 and 5', and also can detect the recorded magnetization pattern with a resolving power of 0.3 μm, Jiro Hokkyo et al.; The Japan Applied Magnetic Society Letters, Vol. 8, No. 1. 1984.

In FIG. 3, reference numeral 6 and 6' denote magnetic sensors. In this Example, a WSP type head is used as a magnetic sensor. Magnetic sensors 6 and 6' respectively detect magnetization patterns recorded in the magnetic layers 5 and 5'.

Figure 1:
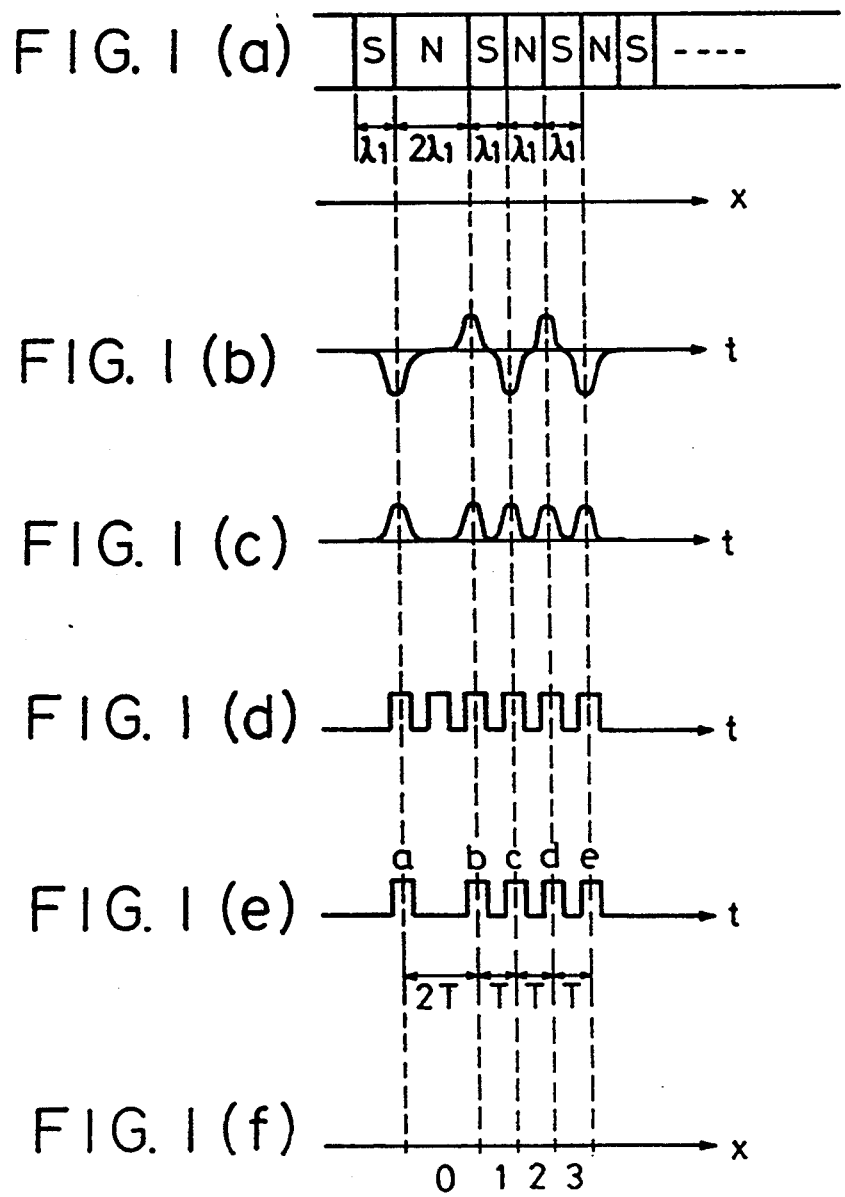
FIG. 1(a) illustrates the magnetization pattern recorded in the magnetic layer.
FIG. 1(b) illustrates a reproducing signal which reads out the magnetization pattern by the magnetic head.
FIG. 1(c) illustrates a rectifier signal which rectifies the reproducing signal of FIG. 1(b).
FIG. 1(d) illustrates a clock signal.
FIG. 1(e) illustrates a pulse which occurs after comparing a rectifier signal of FIG. 1(c) with a clock signal of FIG. 1(d) and FIG. 1(f) illustrates a coordinate axis corresponding to the magnetization pattern of FIG. 1(a)

Reference numeral 7 is a magnetic signal treating device for treating the signal from the magnetic sensors 6 and 6' as shown in FIG. 1, reference numeral 8 is a driving circuit of coarse movement mechanism for making the coarse movement mechanism operate based on the signal from the magnetic signal treating device 7.

Reference numeral 9 and 9' respectively are coarse movement mechanisms of x-direction and y-direction. Reference numeral 10 is a probe electrode for recording information in a recording layer 4 and for reproducing recorded information. Reference numeral 11 is a fine movement mechanism for making the probe electrode move finely in three dimensions.

Figure 6:
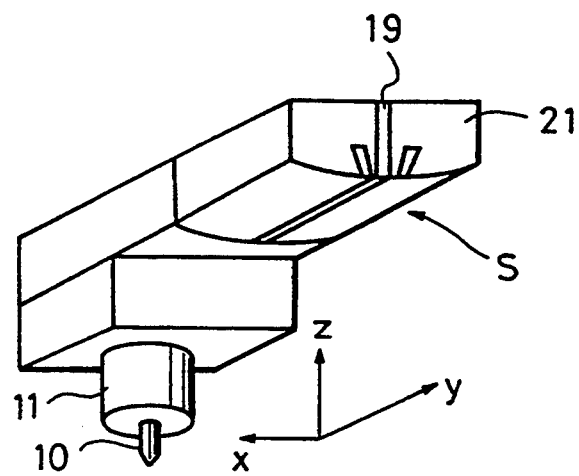
FIG. 6 illustrates a combined probe and magnetic head in Examples 1 and 2.

In this Example, magnetic sensor 6, fine movement mechanism 11 and probe electrode 10 are combined into one unit, as shown in FIG. 6. In FIG. 6, S is a surface opposite to the magnetic layer 5, and probe electrode 10 is parallel to the plane which contains a principal magnetic pole 19 of the magnetic sensor 6.

On the other hand, as shown in FIG. 3, the magnetic sensor 6' is combined with a substrate containing a magnetic layer 5. A probe electrode 10 is parallel to a plane which contains a principal magnetic pole of the magnetic sensor 6' and the plane which contains a principal magnetic pole 19 of the magnetic sensor 6.

In FIG. 3, 12 is a probe current amplifier. Reference numeral 13 is a servo circuit for controlling the fine movement mechanism 11 so as to keep the probe current constant.

Reference numeral 4 is a driving circuit of fine movement for driving the fine movement mechanism 11.

Reference numeral 15 is a power supply for applying a pulse voltage between a probe electrode 10 and a substrate electrode 3. By applying a pulse voltage exceeding a threshold value to the squarilium dye of the recording layer 4, information is recorded in the recording layer 4. When the threshold value is exceeded the conductivity of the recording layer 4 changes significantly from its original conductivity. The recorded information can be read by detecting the bit having the changed conductivity by STM. Reference numeral 15' is a power supply for applying a bias voltage between a probe electrode 10 and a recording layer 4 during reproduction of information. Reference numeral 16 is a computer for controlling the whole apparatus.

Figure 7:
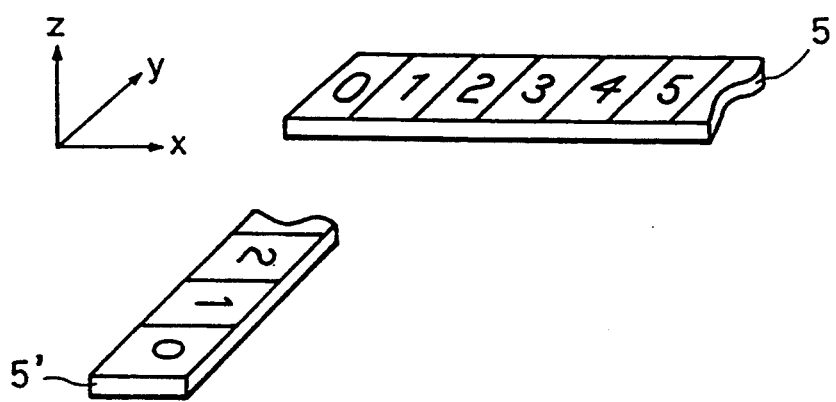
FIG. 7 illustrates the coordinates axis designated by the magnetization pattern in Example 1.

Next, the spatial configuration of magnetic layers 5 and 5' are explained. In this Example, magnetic layers 5 and 5' are not on the same plane, but are arranged so as to be parallel each other. The repeated direction of N and S of the magnetization pattern recorded in magnetic layers 5 and 5' is placed so as to be perpendicular to each other. Repeated patterns N and S recorded in magnetic layers 5 and 5' are numbered such as 0,1,2 . . ., based on the principle explained in FIG. 1, as shown in FIG. 7. Accordingly, the arrangement of a magnetization pattern as shown in FIG. 2 may occur by moving the magnetic layer 5 in the y-direction.

On the other hand, the magnetic sensor 6' is placed on a substrate containing the magnetic layer 5 so as to scan above the magnetic layer 5'.

Next, position detection used in this Example 1 is explained. As mentioned above, by arranging the magnetic layers 5 and 5' in which magnetization patterns are recorded, it is possible to introduce x-y coordinates on the recording layer 4 and to divide the recording layer into regions designated by coordinates as shown in FIG. 2. In this example, the size of the region is 0.3 $\mu m \times 0.3$ $\mu m$.

The coarse movement of a probe electrode 10 to a region designated by a coordinate (3,2) is performed as follows.

The probe can be moved into a desired region by moving respectively principal magnetic poles of magnetic sensors 6 and 6' into magnetization regions defined by "3" and "2" on magnetic layers 5 and 5' shown in FIG. 7, based on a relationship of position between magnetic sensors 6 and 6' and a probe electrode 10 as described above.

The principle of positional detection by magnetic sensor 6 and 6' is illustrated in FIG. 1.

In Example 1, positional control of coarse movement of a probe electrode in a planar direction of a recording layer 4 is performed. In particular, information-recording is performed by moving a probe electrode 10 into regions designated by coordinates (3,2), (10,20) and (50,100) on a recording layer. Counting of pulses in moving into these regions is conducted by computer 16. At the same time, coordinates of regions in which recording is performed are also recorded in the memory of computer 16.

Reproducing of recorded information is performed by moving probe electrode 10 into the regions (3,2), (10, 20) and (50, 100). At this time, positional control of a probe electrode 10 is performed in the same way as described above.

Example 2

Figure 8:
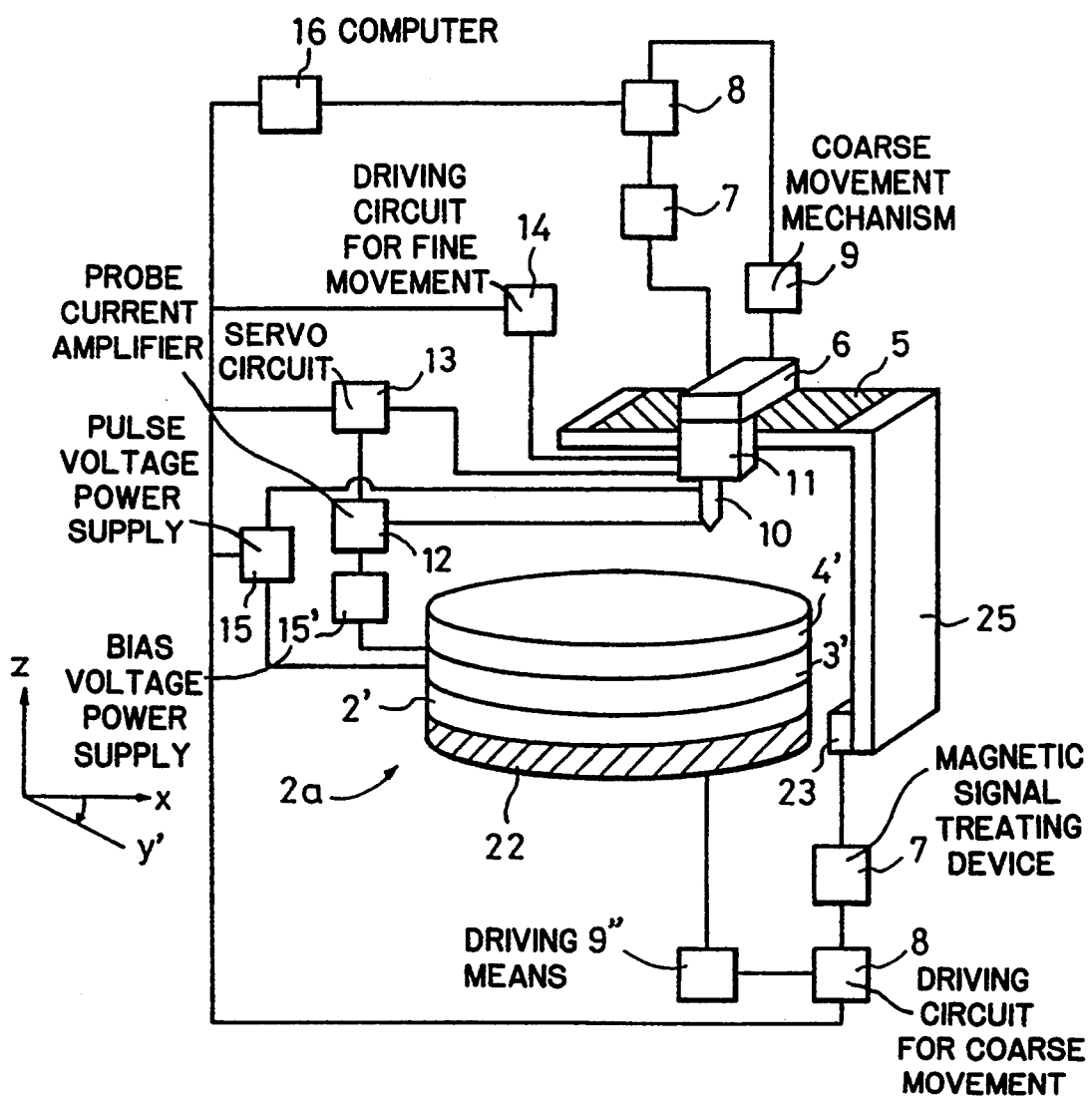
FIG. 8 is a block diagram illustrating an information processing apparatus of Example 2.

A second embodiment is illustrated in FIG. 8. As shown in FIG. 8, a recording layer 4 is characterized in that it has a circular form and turns on a center of the circle. A driving means 9" is provided to rotate the circular recording layer on its vertical axis.

In FIG. 8, magnetic layer 22 is laminated on a side of a circular substrate 2' of recording unit 2a. The magnetic layer 22 is prepared by sputtering a Co—Cr layer being 0.15 $\mu m$ thick on a NiFe layer being 0.5 $\mu m$ thick.

23 is a magnetic sensor which detects a magnetization pattern recorded in a magnetic layer 22. 9" is a coarse movement mechanism which rotates the recording unit 2a.

In Example 2, probe electrode 10 and principal magnetic sensor 6, which is the same WSP type head as used in Example 1, are coplanar and probe electrode 10 is placed parallel to a principal magnetic pole of a magnetic sensor 6. However, a plane containing a principal magnetic pole of a magnetic sensor 6 is perpendicular to a plane containing a principal magnetic pole of a magnetic sensor 23. A magnetic layer 5 and a magnetic sensor 6 are combined with a connecting plate 25.

Figure 9:
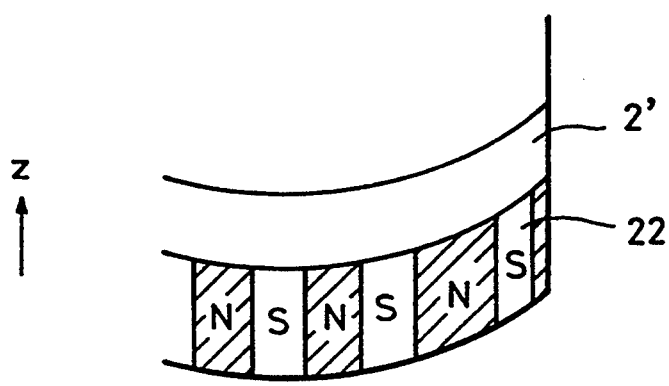
FIG. 9 is an illustration showing the magnetization pattern recorded in the side of the recording medium in Example 2.

Next, in a magnetic layer which comprises a Co—Cr layer prepared as in Example 1, a magnetic pattern is formed using the same conditions as in Example 1. The magnetization pattern recorded in the magnetic layer 5 is defined as the x-axis. The magnetization pattern recorded in a magnetic layer 22 is illustrated in FIG. 9.

The magnetic pattern is formed under the same conditions as in Example 1.

Figure 10:
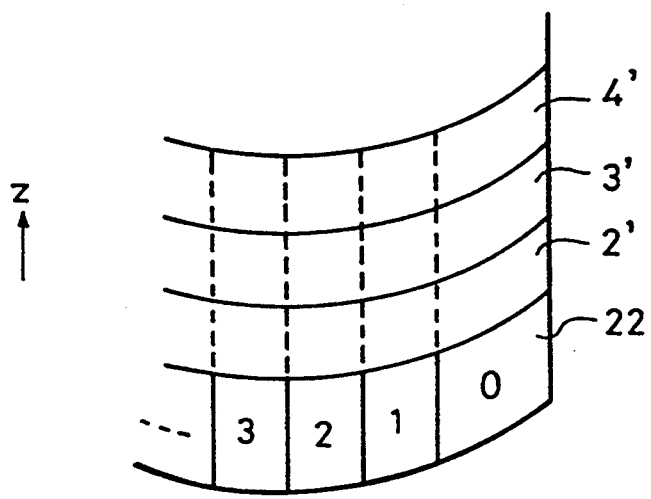
FIG. 10 is an illustration showing numbering of the magnetization pattern of FIG. 9.
Figure 11:
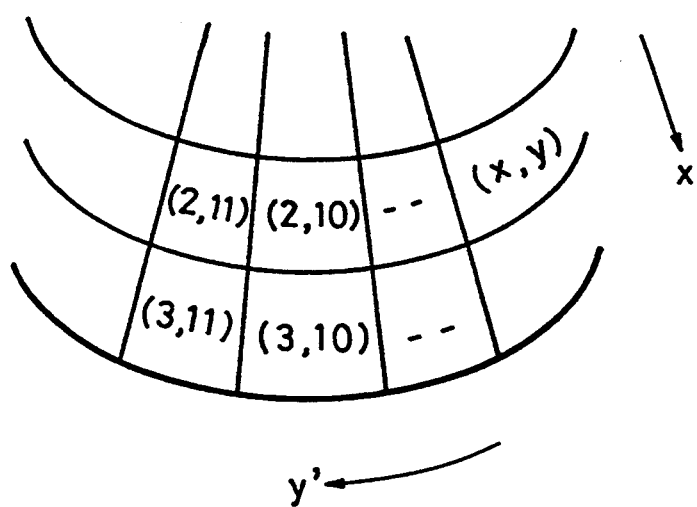
FIG. 11 is an illustration showing a setup of two-dimensional coordinates described in Example 2.

Coordinates which utilize the magnetization pattern formed in a magnetic layer 22 are defined in an angular direction y' as shown in FIGS. 8 and 11 in which a repeated pattern of N and S is numbered in the manner shown in FIG. 1. The coordinates y' can designate a position of a side of a recording layer 4' as shown in FIG. 10. In Example 2, a recording layer 4' is considered by dividing it into regions capable of being designated using coordinates and the shape of the regions is shown in FIG. 11. Herein, the construction of other apparatus and the principle of position detection in the present Example are the same as in Example 1. Using an apparatus shown in FIG. 8, coarse movement of a probe electrode 10 and recording and reproducing information are performed. It is confirmed that information can be recorded and reproduced. It is also found that there is an advantage in this embodiment in that the driving mechanism is simpler for rotating a recording medium than for preforming linear movement of a recording medium.

Example 3

Figure 12:
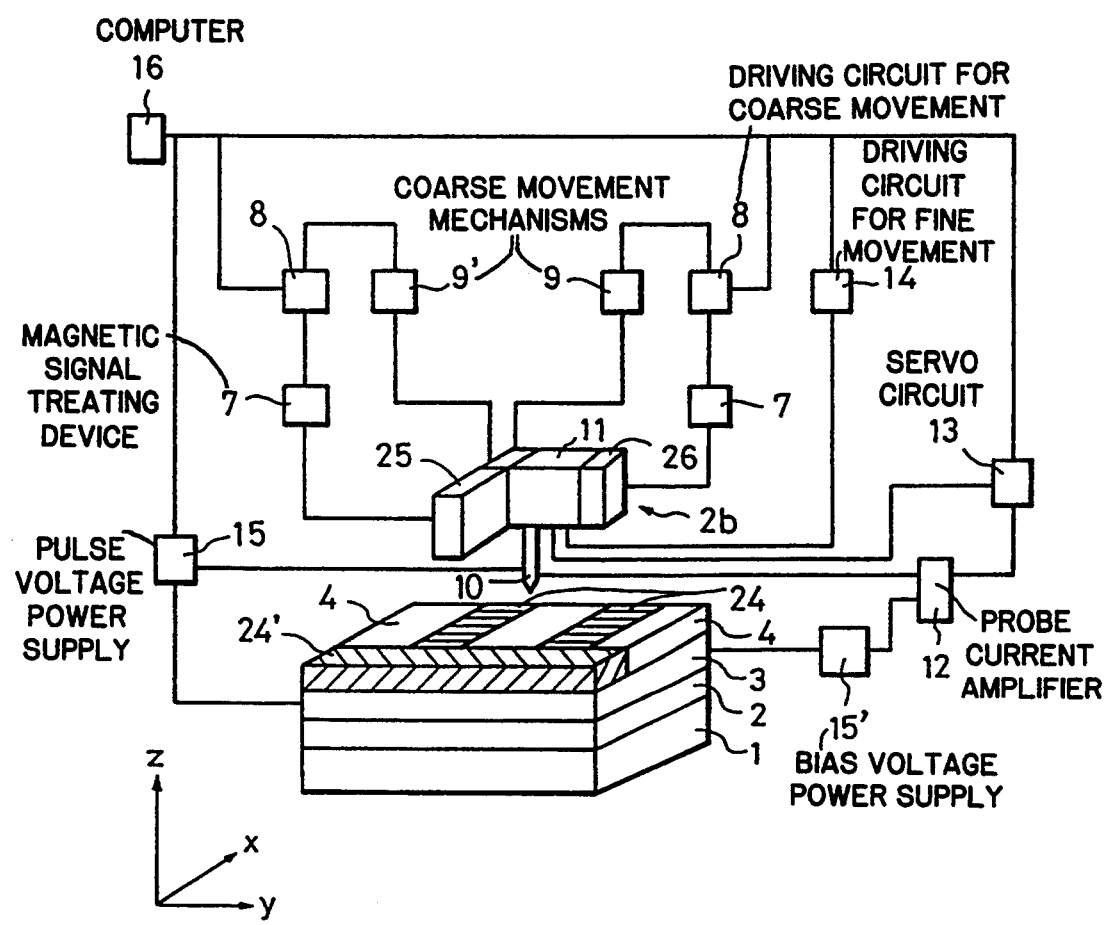
FIG. 12 is a block diagram illustrating an information processing apparatus of Example 3.

This embodiment is explained by reference to FIG. 12. Reference numeral 25 and 26 are WSP-type magnetic heads which respectively detect the magnetization patterns of the recording layers 24' and 24, in which the magnetization patterns for x-axis and y-axis are respectively recorded. The magnetic heads 25 and 26, and a probe electrode 10 are combined in a unit 2b.

As described above, probe electrode 10 is contained in a plane which contains a principal magnetic pole of the magnetic head 25. At the same time, probe electrode 10 is contained in a plane which contains a principal magnetic pole of the magnetic head 26. Therefore, the coordinates which the magnetic heads 25 and 26 detect, are equivalent to the coordinates of probe electrode 10.

Regions in which magnetization patterns are recorded, in Example 3, have the shape of a comb. The magnetization pattern for the x-axis is a single pattern. However, at least two magnetization patterns for the y-axis are formed so as to be perpendicular to the magnetization pattern for the x-axis. A cycle of arrangement of S and N in the direction of the x-axis is 200 $\mu m$. A cycle of arrangement of S and N in the direction of the y-axis is 0.6 $\mu m$.

Figure 13:
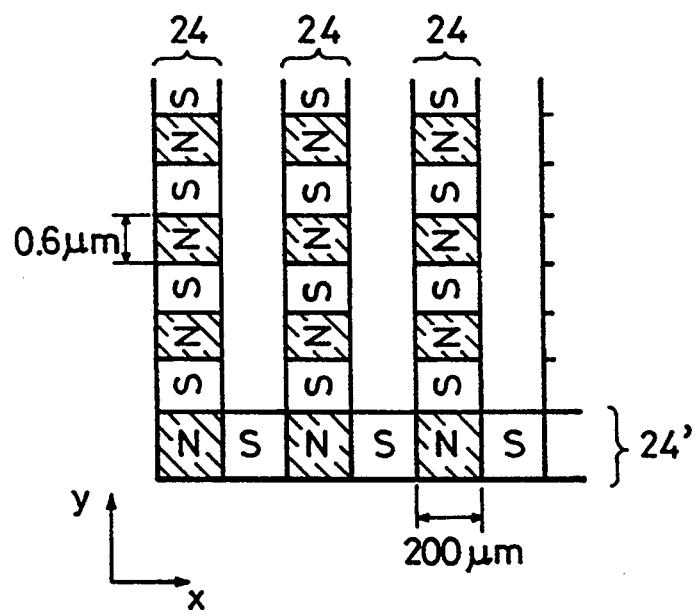
FIG. 13 is an illustration showing the magnetization pattern used in Example 3.

In the magnetization pattern as shown in FIG. 13, regions in which S and N are recorded, are numbered in the same way as explained using FIG. 1.

Figure 14:
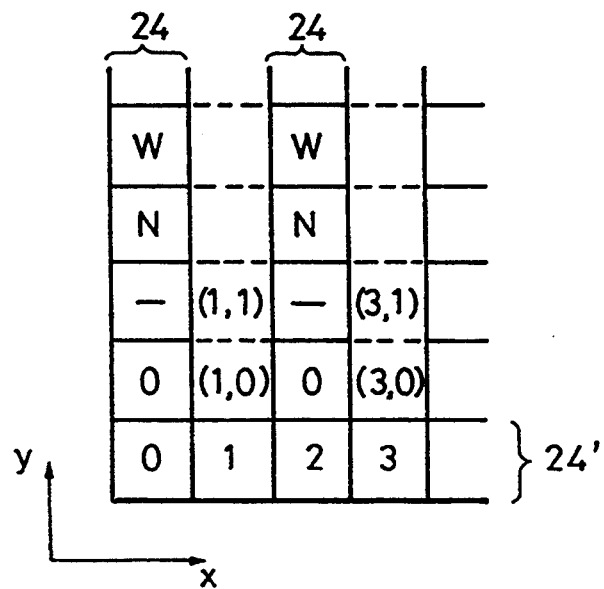
FIG. 14 is an illustration showing a setup of two-dimensional coordinates by the magnetization pattern of FIG. 13.

The result is shown in FIG. 14. When setting up coordinates as shown in FIG. 14, a recording layer 4 can be considered as being divided into regions designated by coordinates. Other operating conditions being the same as in Example 1, an experiment of recording and reproducing is conducted using the apparatus shown in FIG. 12.

First, x coordinates in a desired region above a recording layer are detected using a magnetic head 25 and thereafter y coordinates are detected using a magnetic head 26. It is confirmed that recording and reproducing can be performed.

By placing at least two magnetic patterns parallel to each other and fixed in a recording medium as shown in FIG. 13, there the following effects.. As in Example 1, precise coarse movement of a probe can be performed near a magnetic layer 5' as shown in FIG. 3, but the influence of a thermal draft and the like cannot be compensated for when the probe is apart from magnetic layer 5' as in Example 1.

In Example 3, however, by providing at least two magnetic patterns for the y-axis, influence of a thermal draft can be compensated for.

Example 4

Figure 15:
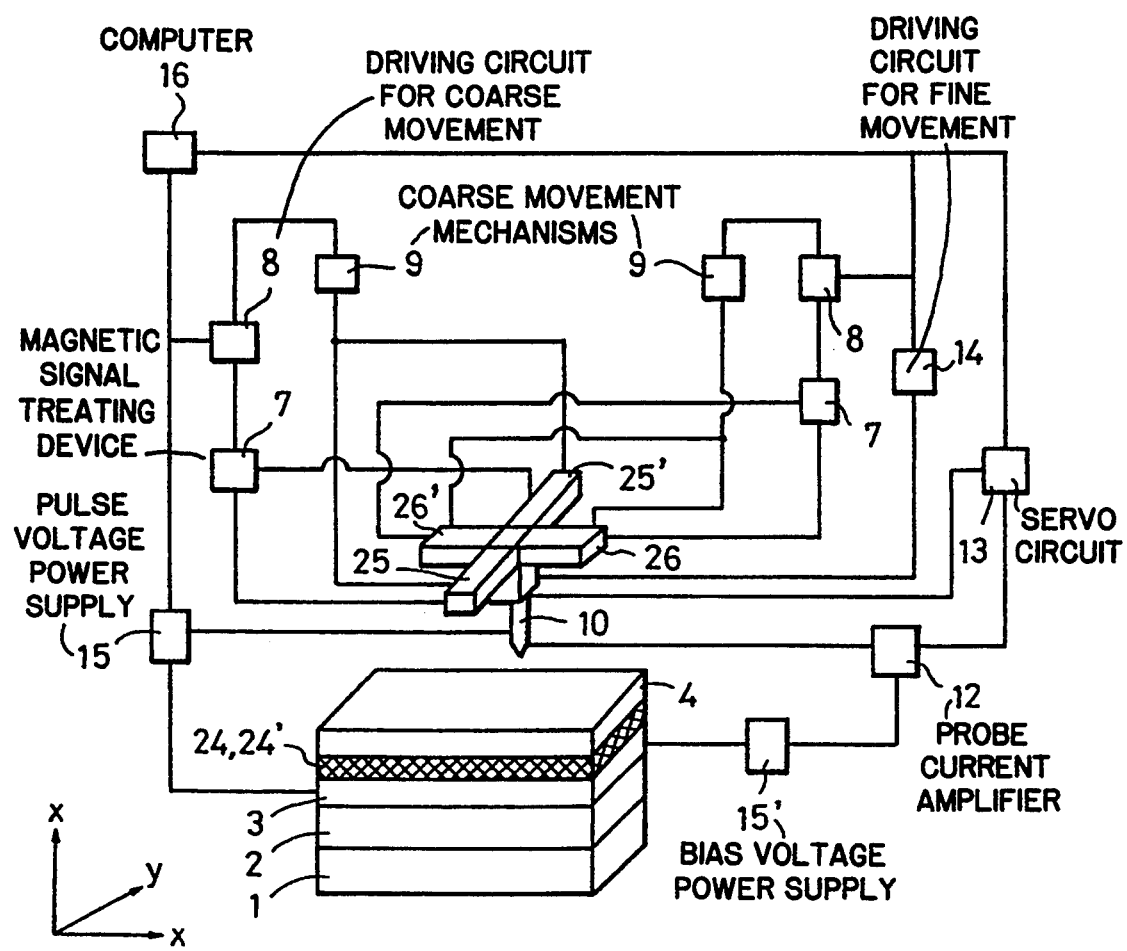
FIG. 15 is a block diagram illustrating an information processing apparatus used in Example 4.
Figure 16:
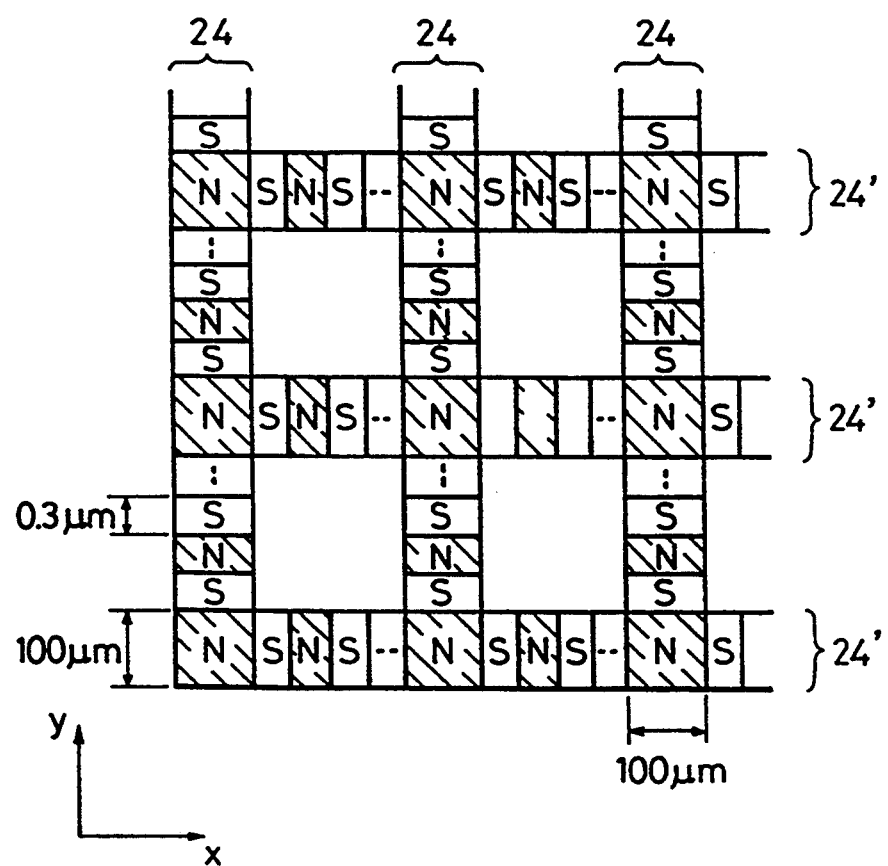
FIG. 16 is an illustration showing the magnetization pattern used in Example 4.

A schematic view of this embodiment is shown in FIG. 15 and the magnetization pattern used in this Example is shown in FIG. 16.

Figure 17:
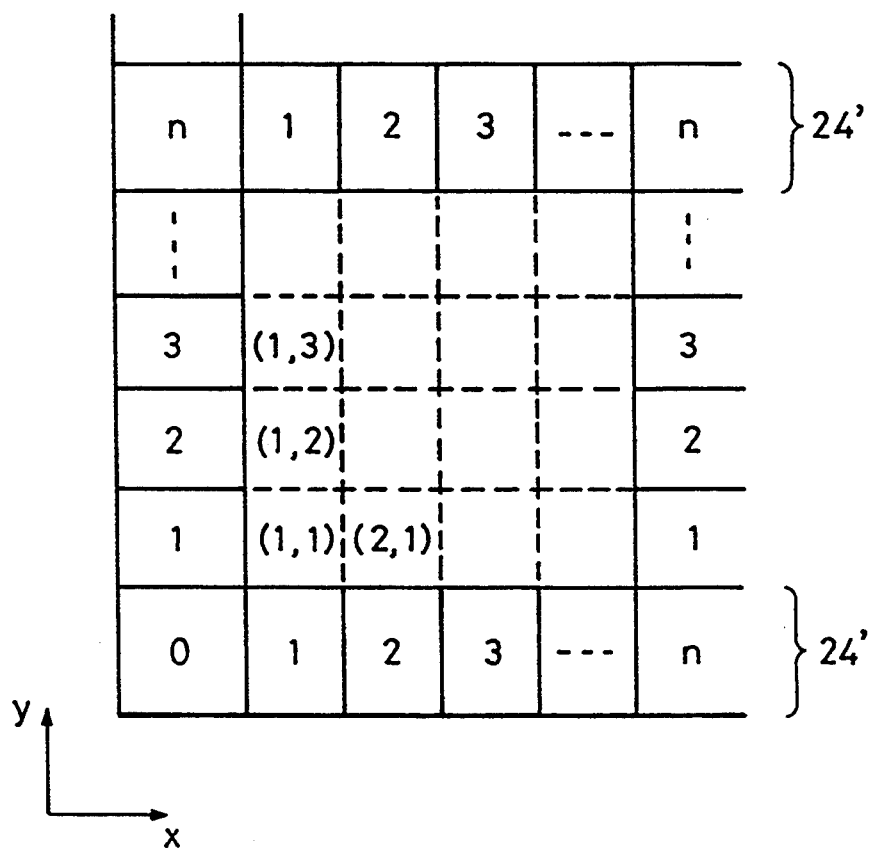
FIG. 17 is an illustration showing a setup of two-dimensional coordinates described in Example 4.

The magnetization pattern in the present Example is in the form of a lattice. FIG. 17 shows how to set up coordinates utilizing a pattern shown in FIG. 16. However in the present Example, the precision of relative position detection between probe electrode 10 and recording layer 4 is improved, compared with the comb arrangement as shown in FIG. 13 for Example 3, because the arrangement of the magnetic pattern is a lattice form. The reason is as follows. In a pattern shown in FIG. 13, the arrangement of the magnetization pattern for the x-axis is singular. In the present Example, the arrangements are plural. Therefore, probe electrode 10 can detect x coordinates even when probe electrode 10 is moved near the center of the recording Layer 4.

Now, in FIG. 15, numerals 25, 26, 25' and 26' are respectively WSP type magnetic heads, principal magnetic poles of 26 and 26' are in the same plane and principal magnetic poles of heads 25 and 25' are on the same plane. Moreover, these two planes are perpendicular to each other, and probe electrode 10 is placed on a line perpendicular to the intersection of these two planes.

Figure 18:
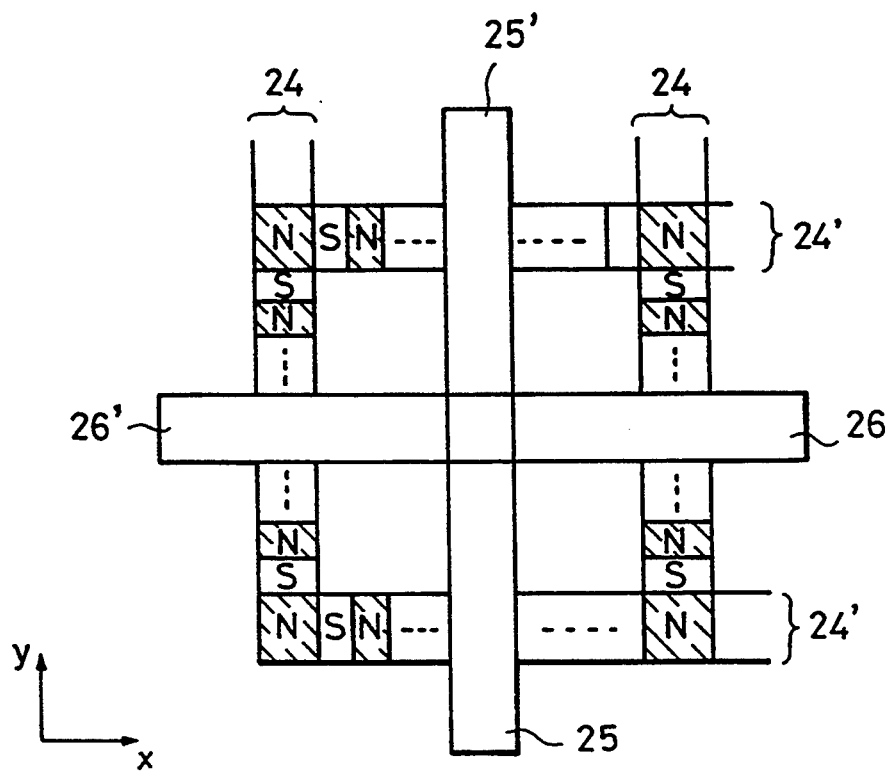
FIG. 18 is an illustration showing a corresponding relationship between the magnetic head and the magnetization pattern in Example 4.

As shown in FIG. 18, magnetic heads 25 and 25' are placed so as to detect a neighboring magnetization pattern 24' for the x-axis and magnetic heads 26 and 26' are placed so as to detect a neighboring magnetization pattern 24 for the y-axis. Accordingly, the precision of position detection is improved, because position detection of a probe electrode 10 is performed using four magnetic heads.

Example 5

This embodiment is explained by reference to FIG. 19. In the present Example, a means for detecting the magnetization pattern and a means for detecting a change of the recording medium are combined, and a means for detecting the magnetization pattern is based on a principle of magnetic force microscopy (MFM). The principle of MFM is that a magnetization state of a sample is examined with high resolving power by detecting magnetic force from the amount in which a structure supporting a needle is bent by receiving a magnetic force acting between a sample and a needle when a needle with magnetic moment is close to a surface of a magnetized sample. [Y. Martin et al., Appl. Phys. Lett. 50, 1455, 1987].

Figure 20:
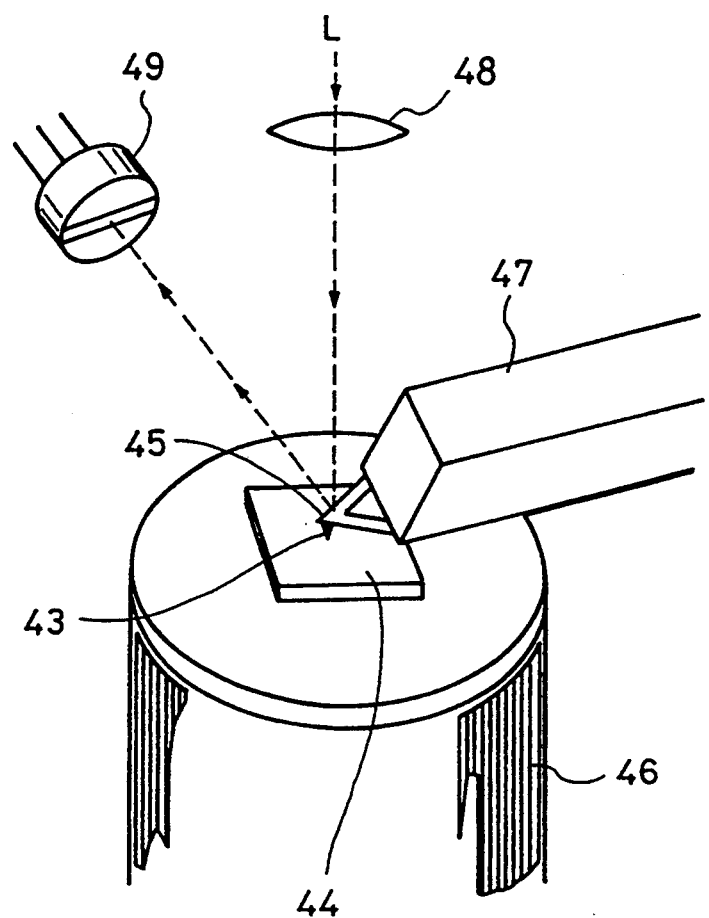
FIG. 20 is a constitutional view of magnetic force microscopy (MFM)

As shown in FIG. 20, MFM consists of a needle 43 with magnetic moment disposed opposite to a surface of a magnetized sample 44, a cantilever 45 (elastic material) for supporting a needle 43, and a system for detecting a lever-bent amount in which the lever is bent by a force acting between a sample and a needle.

Reference numeral 46 is an XYZ driving element, 47 is a lever holder, 48 is a lens, 49 is a dual-divided photodiode and L is a light source.

A system which detects a bend of the cantilever includes a photolever method in which light is irradiated from the back of the cantilever and an amount of a bend is obtained from an amount of position-displacement of a reflected light spot as shown in FIG. 20. As an electronic element for detecting position-displacement of a reflected light spot, conventional dual-divided photodiodes and the like may be employed.

Next, a principle of position control using MFM is described. As an example of a magnetization pattern recorded in the magnetic layer comprising a perpendicular magnetization film, the same magnetization pattern as shown in FIG. 1(a) is considered.

Figure 21:
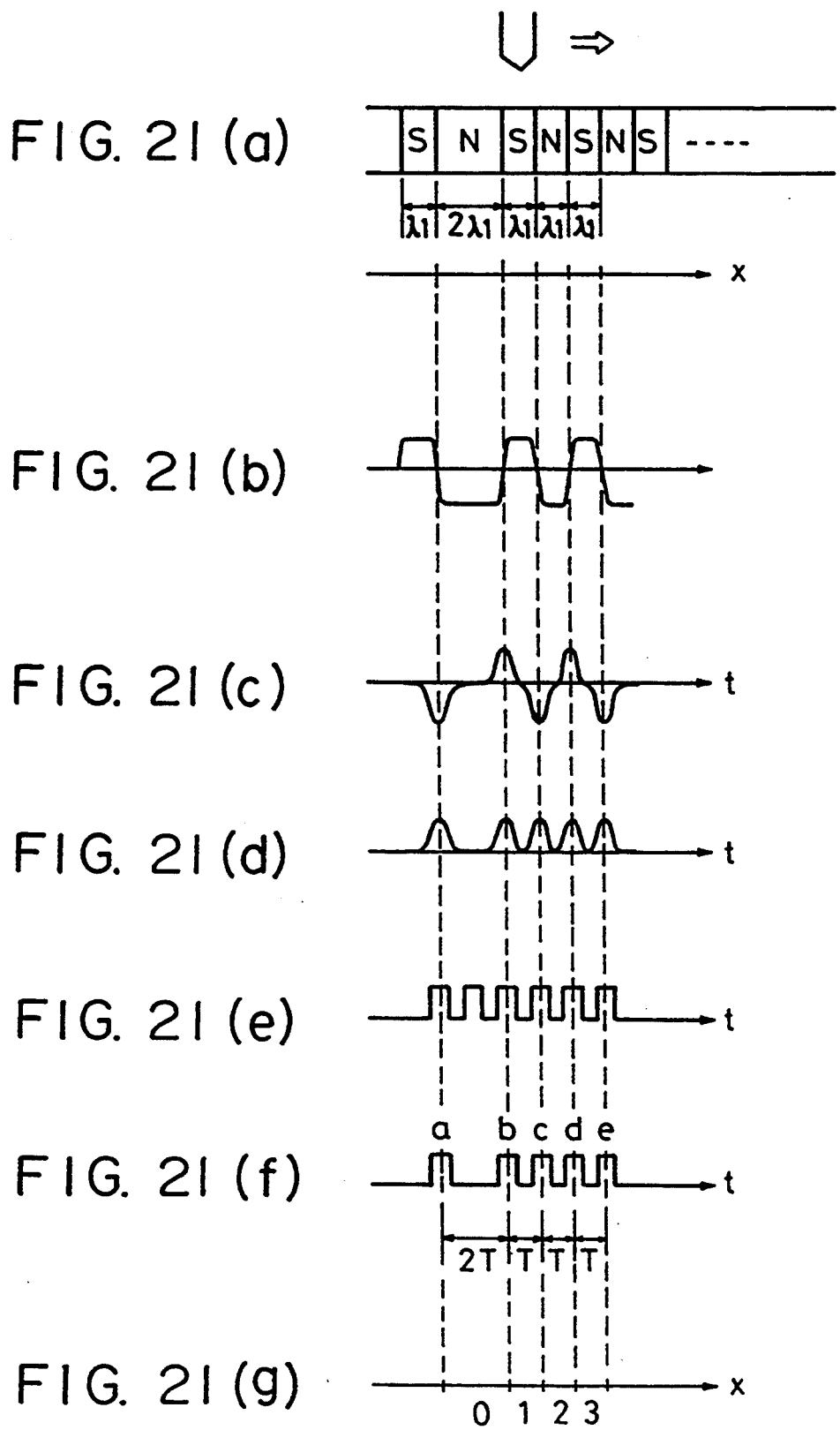
FIGS. 21(a)–21(g) illustrate a position detecting method using MFM.

A probe with magnetic moment in the x-axis direction is scanned. The probe is supported by a cantilever. According to a repeat of N and S, the cantilever is bent and the direction and the amount of bend is outputted from the dual-divided photodiode 49 as a function of time t as shown in FIG. 21(a). The output signal is differentiated as shown in FIG. 21(c), and rectified as shown in FIG. 21(d). If the rectified signal is supposed to be a rectified signal shown in FIG. 1(c), it is possible to read coordinates by a magnetization pattern in the same manner as described above.

Figure 19:
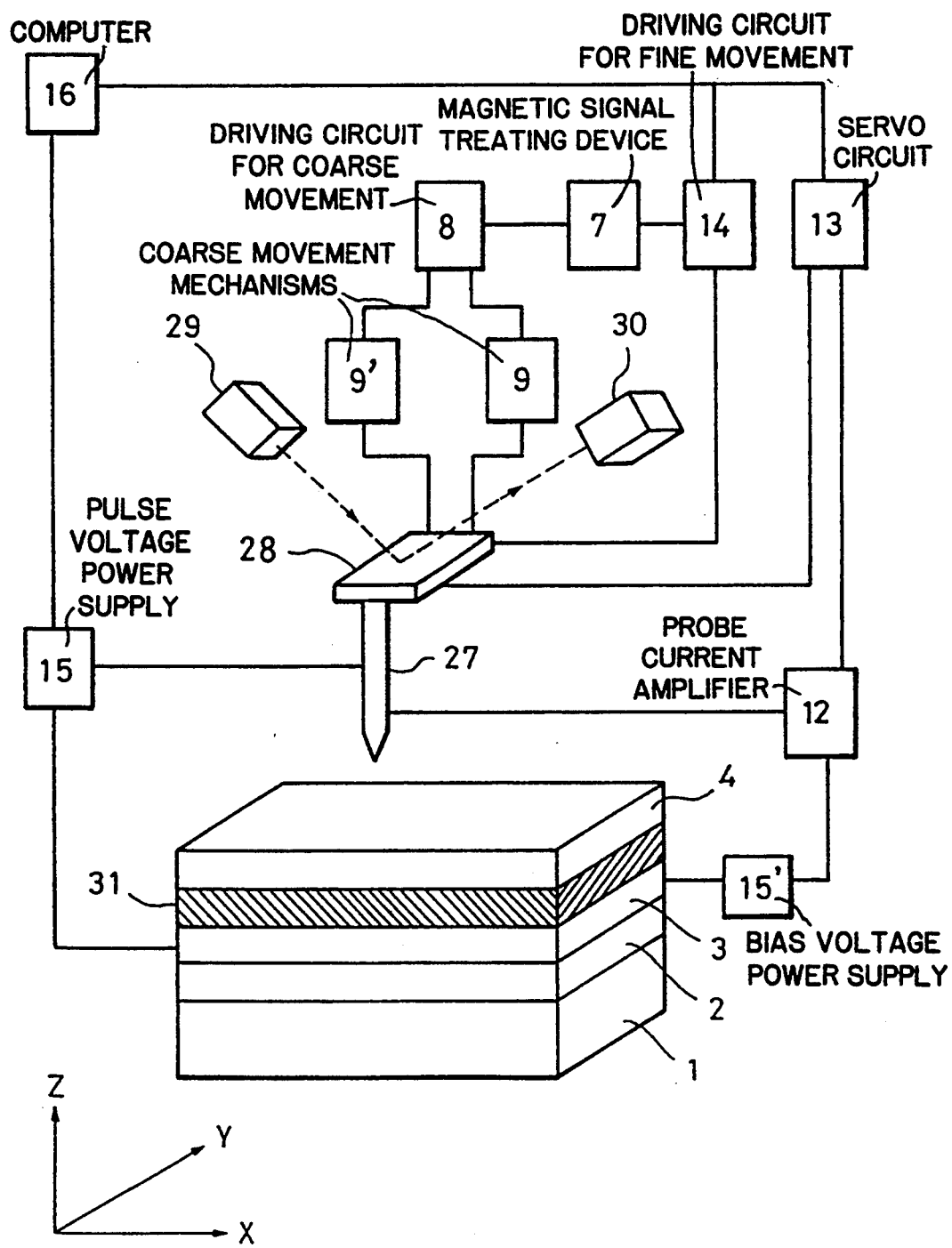
FIG. 19 is a block diagram illustrating an information processing apparatus used in Example 5.

In FIG. 19, reference numeral 27 is a probe for MFM as a magnetic detecting means and for recording information on recording layer 4 and for reproducing the recorded information. Probe 27 is formed by a conductive and ferromagnetic material which satisfies the above two functions.

A method of producing probe 27 having the above physical properties which is supported by a cantilever 28 is shown below. A process of producing a probe is shown in FIGS. 22(a)–(e). First, silicon nitride film 33 is formed on a silicon semiconductive substrate 34 as a protective layer by Low-Pressure-Chemical Vapor Deposition, followed by providing an opening in the protective layer by a photoetching method and then processing the exposed silicon 34 by anisotropic etching using potassium hydroxide solution to form an etched silicon membrane 32 which is 30 μm thick (FIG. 22(a)).

After a bottom electrode 35 is formed on the protective layer 33, a piezoelectric layer 36, an intermediate electrode 37, a piezoelectric layer 38 and an upper electrode 39 are formed on the protective layer 33 in order to form a piezoelectric bimorph. As electrodes, a gold (Au) layer 100 nm thick formed by vacuum evaporation is used. As the piezoelectric material, ZnO which is 300 nm thick and formed by a magnetron sputtering method is used (FIG. 22(b)).

A proprietary photoresist, RD-2000N photoresist (tradename, available from Hitachi Chemicals), is coated on the entire exposed surface in a 2.0 μm thick coat as a lift-off layer 40. An opening 40 which is 2 microns in size is formed by a photolithography method. Then Au as a probe material is vapor-deposited on the lift-off layer 40 and Co is vapor-deposited thereon to form layer 41 and probe 27.

As a probe material, CoPtCr may be used. This material can be deposited on the lift-off layer 40 by the sputtering method.

Next, silicon membrane 32 is processed by plasma etching, followed by removing the lift-off layer 40 using acetone to produce a cantilever-type probe (FIG. 2(d), (e)).

A cantilever-type probe produced in this manner is observed by using a scanning electron microscope (SEM), and as a result the probe is found to be conic.

After the probe 27 is formed in this matter, an external magnetic field is applied to the probe parallel to the longitudinal direction of the probe. By this application, the magnetic moment of the probe can be rendered parallel to the longitudinal direction of the probe. The external magnetic field is applied by a Helmholtz coil and the strength is 15 KGauss. In this manner, the probe 27 is formed in an opening. (FIG. 22(c)).

In FIG. 19, reference numeral 29 is a semiconductor laser for irradiating light on a back of cantilever 28, and 30 is a dual-divided photodiode for detecting a position displacement of a laser spot reflected from cantilever 28. Reference numeral 31 is a magnetic layer. A magnetic layer 31 in the present Example comprises a NiFe layer 0.5 μm thick and a Co—Cr layer 0.15 μm thick formed thereon by sputtering using the same method as in Example 1.

Figure 23:
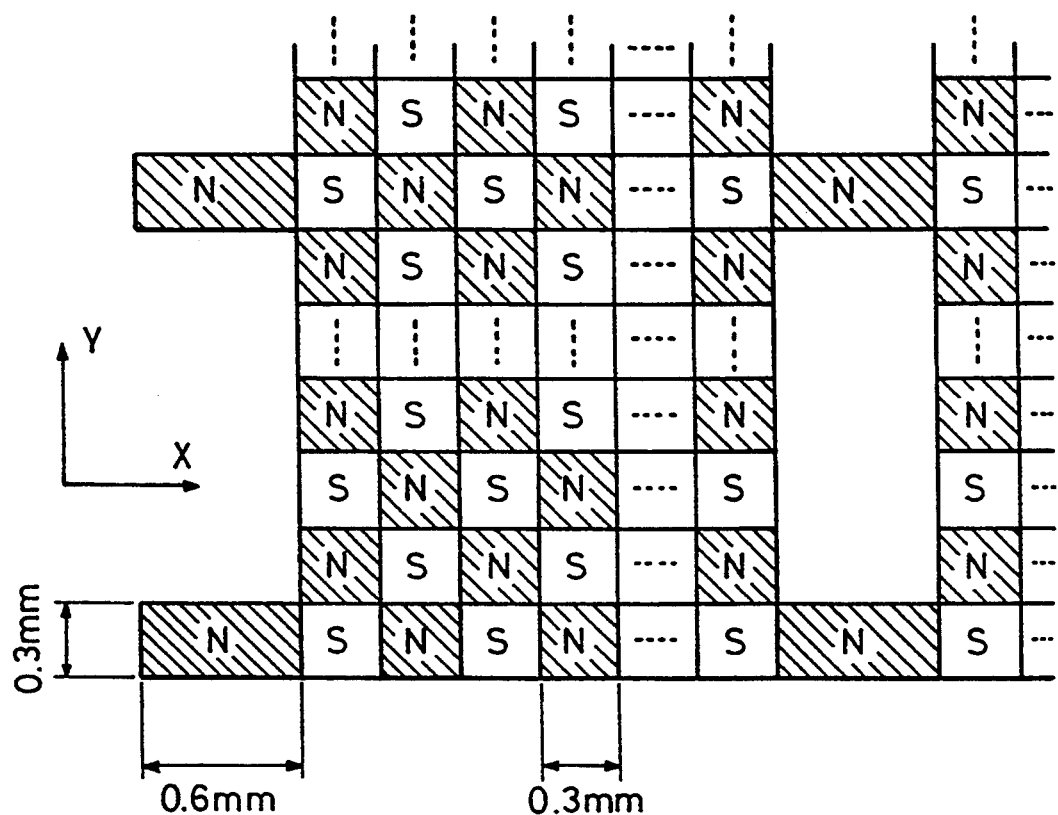
FIG. 23 is an illustration showing the magnetization pattern used in Example 5.

A magnetization pattern is recorded vertically in the magnetic layer using WSP a type magnetic head in the same manner as in Example 1. In the present example, a magnetization pattern is used such as a pattern in which the N pole and S pole are checkwise arranged as shown in FIG. 23. Recording pitches of N and S are 0.3 μm in the direction of both the x-axis and y-axis (standard position is a rectangle with a size of 0.3 μm×0.6 μm).

Figures 24, 25:
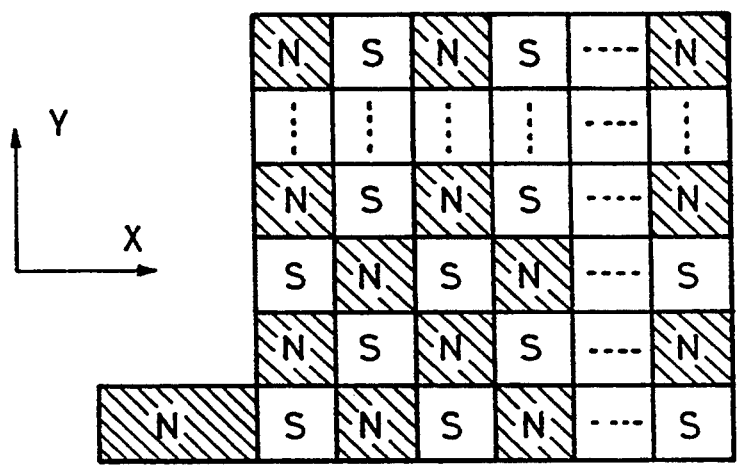
FIG. 24 is an illustration showing a unit cell of the magnetization pattern used in Example 5.
FIG. 25 is an illustration showing coordinates designated by the magnetization pattern used in Example 5.

The magnetization pattern comprises a plurality of unit cells of a magnetization pattern as shown in FIG. 24. In FIG. 25, the origin portions of each unit cell are marked, such as 0-(0,0) and 0-(0,1) and the like. As shown in FIG. 25, each unit cell is differentiated. A magnetization pattern of N and S within each unit cell corresponds to (1,0) and (1,1) or the like as shown in FIG. 25.

In the present Example, recording layer 4 is provided on magnetic layer 31. Accordingly, the recording layer 4 can be considered by dividing it into regions designated by each unit cell and, at the same time, by dividing it into regions designated by coordinates within each unit cell. According to Example 5, the following characteristics are obtained:

(1) The precision of position decision of probe 27 is further improved, because a magnetic sensor and a probe for recording and reproducing are combined and the magnetization pattern is checkerwise;

(2) The time necessary to move probe 27 to a desired position is further reduced, because the unit cells as shown in FIG. 24 are introduced into the magnetization pattern; and (3) An extremely precise position decision is possible because the principles of MFM are used in positioning and it is possible to make a recording region of N and S in the magnetization pattern a size of a monomagnetic domain.

When a standard scale which makes use of a magnetization pattern is not employed as in the recording and reproducing experiments in Example 1-5, the coarse movements of a probe to a desired position above the recording medium are very difficult to perform with precision on the submicron order.

According to the present invention, the following features and advantages are obtained:

(1) Position control of the probe during coarse movements becomes easier with precision on the submicron order being possible;

(2) A recording layer can be divided into regions on a size of submicron order and these regions can be differentiated by adding coordinates.

As the result, computer control of movement of the probe and position control during recording and reproducing becomes easier. At the same time, the recording of information is differentiated by adding coordinates on the information; and (3) In an information processing apparatus utilizing a principle of STM, the position control of the present invention can be applied to the x-y stage used in other fields, such as an exposure apparatus, ion beam-electron beam drawing apparatus and the like.

The invention is not to be limited except as set forth in the following claims.

What is claimed is:

1. A method for positioning an information processing head at a predetermined position on a recording medium, said method comprising the steps of:

detecting a predetermined magnetization pattern on a magnetic material having a predetermined positional relation to a recording region of the recording medium by a magnetization detector having a predetermined positional relation to the information processing head;

generating a signal indicative of a relative position of the information processing head with respect to the recording medium based on a result of said detecting step; and moving the information processing head and the recording medium relatively to position the information processing head at the predetermined position with respect to the recording medium based on the generated signal.

2. A process for forming a cantilever-type probe capable of indicating a magnitude of a magnetic force between the probe and a recording medium and capable of performing at least one of a recording operation and a reproducing operation on the recording medium, said process comprising the steps of:

forming a first protective layer on a first surface of a semiconductive substrate and forming a second protective layer on a second surface of the substrate that is opposite to the first surface;

photoetching a portion of the first protective layer to create an opening in the first protective layer which exposes a portion of the substrate;

etching the exposed portion of the substrate to form an etched silicon membrane at the opening in the first protective layer;

etching the second protective layer at a position opposite to the etched silicon membrane to form an opening in the second protective layer;

forming a first electrode layer, a first piezoelectric layer, an intermediate electrode layer, a second piezoelectric layer, and an upper electrode layer successively on a portion of the second protective layer adjacent to the opening therein to form a piezoelectric bimorph;

coating the exposed portions of the layers on the second surface of the substrate with a photoresist to form a lift-off layer;

forming a probe opening in the lift-off layer at an end of the upper electrode nearest the opening in the second protective layer;

depositing ferromagnetic material on the lift-off layer and in the probe opening in the lift-off layer to form a probe in that opening;

plasma etching the etched silicon membrane to remove the membrane and to sever the substrate at a position adjacent to the opening in the second protective layer; and removing the lift-off layer to form the cantilever-type probe; and applying an external magnetic field to the probe so as to magnetize the probe.

3. A method for positioning an information processing head at a predetermined position on a recording medium, said method comprising the steps of:

detecting a two-dimensional grating magnetization pattern having a predetermined positional relation to a recording region of the recording medium;

generating a signal indicative of a relative position of the information processing head with respect to the recording medium based on a result of said detecting step; and moving the information processing head and the recording medium relatively to position the information processing head at the predetermined position with respect to the recording medium based on the signal generated in said generating step.

4. A method according to claim 3, wherein the information processing head is a magnetized probe, and said detecting step comprises detecting the magnetization pattern in accordance with a displacement of the probe.

* * * * *

UNITED STATES PATENT AND TRADEMARK OFFICE
CERTIFICATE OF CORRECTION

PATENT NO. : 5,448,421
DATED : September 5, 1995
INVENTOR(S) : HIROSHI MATSUDA, ET AL.

It is certified that error appears in the above-indentified patent and that said Letters Patent is hereby corrected as shown below:

ON THE COVER PAGE:

Under Item [54] "TITLE"

"CANTILEVER TYPE" should read --CANTILEVER-TYPE--;

Under "FOREIGN PATENT DOCUMENTS"

"63-161552   5/1988   Japan" should read
--63-161552   7/1988   Japan-- and

Under "OTHER PUBLICATIONS"

"50, No. 20, Mar. 1987," should read --50, No. 20, May 1987,--.

COLUMN 1:

Line 8, "CANTILEVER TYPE" should read --CANTILEVER-TYPE--.

COLUMN 3:

Line 34, "vertical" should read --the vertical--.

UNITED STATES PATENT AND TRADEMARK OFFICE
CERTIFICATE OF CORRECTION

PATENT NO. : 5,448,421
DATED : September 5, 1995
INVENTOR(S) : HIROSHI MATSUDA, ET AL.

It is certified that error appears in the above-indentified patent and that said Letters Patent is hereby corrected as shown below:

COLUMN 5:

Line 28, "mount 1o" should read --mount 1.--;
Line 41, "numeral" should read --character--; and
Line 65, "how" should read --shown--.

COLUMN 6:

Line 5, "numeral" should read --numerals--;
Line 12, "FIG. 1, reference" should read --FIG. 1. Reference--;
Line 13, "of" should read --of a--;
Line 40, "numeral 4" should read --numeral 14--; and
Line 59, "parallel" should read --parallel with--.

COLUMN 7:

Line 50, "23" should read --Reference numeral 23--.

COLUMN 8:

Line 26, "numeral" should read --numerals--; and
Line 65, "there" should read --there are--.

UNITED STATES PATENT AND TRADEMARK OFFICE
CERTIFICATE OF CORRECTION

PATENT NO. : 5,448,421
DATED : September 5, 1995
INVENTOR(S) : HIROSHI MATSUDA, ET AL.

It is certified that error appears in the above-indentified patent and that said Letters Patent is hereby corrected as shown below:

COLUMN 9:

Line 27, "in" should read --on--.

Figure 22:
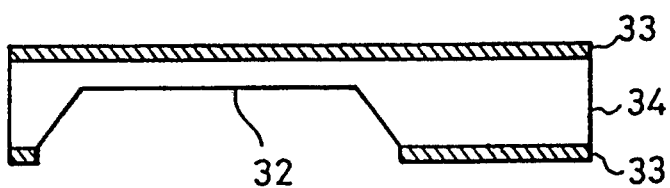
FIGS. 22(a)–22(e) illustrate a manufacturing method of a probe and cantilever.
Figure 22:
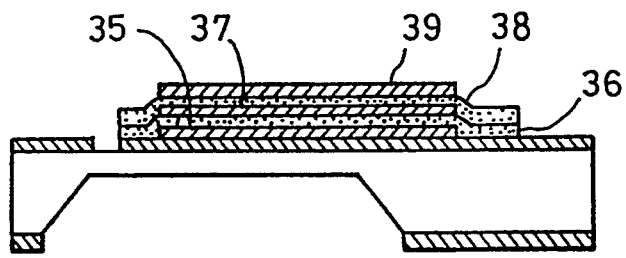
Figure 22:
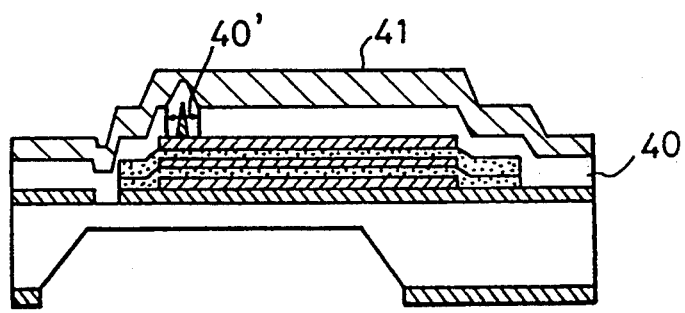
Figure 22:
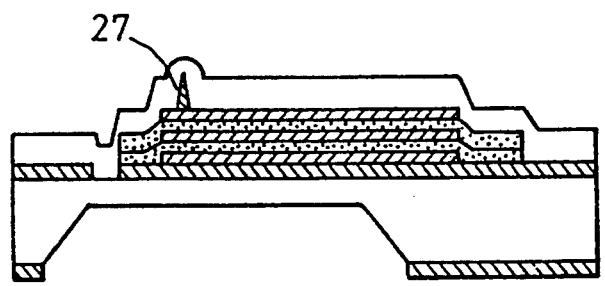
Figure 22:
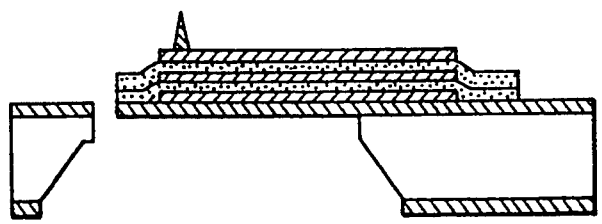

COLUMN 10:

Line 37, "(FIG. 22(a))" should read --(FIG. 22(a)).--; and
Line 38, the period (the entire line) should be deleted.

Signed and Sealed this

Second Day of April, 1996

Attest:

BRUCE LEHMAN

Attesting Officer

Commissioner of Patents and Trademarks